US006983703B2

(12) United States Patent
Chen et al.

(10) Patent No.: US 6,983,703 B2
(45) Date of Patent: Jan. 10, 2006

(54) DRIVING MEANS TO POSITION A LOAD

(75) Inventors: Wen Chen, Singapore (SG); You Yong Liao, Singapore (SG)

(73) Assignee: ASM Technology Singapore PTE LTD, (SG)

( * ) Notice: Subject to any disclaimer, the term of this patent is extended or adjusted under 35 U.S.C. 154(b) by 284 days.

(21) Appl. No.: 10/288,620

(22) Filed: Nov. 5, 2002

(65) Prior Publication Data

US 2004/0083929 A1 May 6, 2004

(51) Int. Cl.
*A47B 85/00* (2006.01)

(52) U.S. Cl. .......................................... 108/20; 355/53

(58) Field of Classification Search .................. 108/20; 355/53, 72; 250/497.2; 318/649
See application file for complete search history.

(56) References Cited

U.S. PATENT DOCUMENTS

| | | | | |
|---|---|---|---|---|
| 5,172,160 | A * | 12/1992 | Van Eijk et al. | 355/53 |
| 5,260,580 | A * | 11/1993 | Itoh et al. | 250/492.2 |
| 5,844,664 | A | 12/1998 | Van Kimmenade et al. | 355/53 |
| 6,693,402 | B2 * | 2/2004 | Ebihara et al. | 318/649 |
| 6,717,653 | B2 * | 4/2004 | Iwamoto et al. | 355/72 |

* cited by examiner

*Primary Examiner*—Jose V. Chen
(74) *Attorney, Agent, or Firm*—Ostrolenk, Faber, Gerb & Soffen, LLP

(57) ABSTRACT

The disclosure provides an apparatus and method for positioning a moveable mass, such as the moveable components found in a typical XY table. The apparatus comprises driving structure producing a driving force to move the mass along an axis, which mass has a variable center of gravity position perpendicular to the axis. The driving force from the driving structure is operative to act through the center of gravity of the mass as the position of the center of gravity changes.

13 Claims, 3 Drawing Sheets

DRIVING MEANS TO POSITION A LOAD

FIELD OF THE INVENTION

The invention relates to a motor system for driving and positioning a load, such as a stage of an XY table.

BACKGROUND AND PRIOR ART

In a conventional XY table, a first motor is used to drive a first stage of the XY table and a second motor is used to drive a second stage of the XY table. The second stage is usually mounted onto the first stage. A load, such as that comprising a bond head and bonding member, is attached to the second stage and moves with it. Commonly, the first stage is called an X stage which moves the XY table in an X-axis and the second stage is called a Y stage which moves the XY table in a Y-axis. A combination of movement of the X and Y stages result in the positioning of the load in an X-Y plane.

The load, together with the X and Y stages of the XY table, comprise a moving mass of the XY table which mass has a combined weight that is concentrated in a center of gravity approximately located centrally in the XY table structure when it is in an equilibrium position. At the equilibrium position, when the X stage is driven, the orientation of the X stage is such that a motor driving the X stage ("X motor") generates a force that is aligned with the center of gravity of the mass when the Y stage is in a home or central position.

However, a problem with mounting the Y stage onto the X stage is that the said center of gravity of the moving mass shifts when the Y stage moves. This will happen no matter how well the driving force is aligned with the center of gravity at the equilibrium position. Once the center of gravity moves, the driving force will not be aligned with the center of gravity. When the driving force is not aligned with the center of gravity, a turning moment is generated that is equal to the driving force multiplied by the distance that the center of gravity is shifted from the equilibrium position. This undesirable turning moment causes the moving mass to vibrate as the mass is moved, thereby increasing the performance differential and increasing the amount of time required for accurate positioning at a given location, since such vibration will cause some positional offset. The further the Y stage moves away from the equilibrium position, the greater the turning moment that induces vibration.

Problems associated with displacement of the center of gravity as an object or load is moved are identified in U.S. Pat. No. 5,844,664 for "Positioning Device with a Force Actuator, System for Compensating Center-of Gravity Displacements, and Lithographic Drive provided with such a Positioning Device". The patent discloses a positioning device and a method to compensate for shifts in the center of gravity. A plurality of vertically-arranged force actuator systems generate compensation forces to balance an object table when the center of gravity moves as the object table is displaced. Although a balancing force is generated as a passive response to the movement of the center of gravity, there is no disclosure of how to align the driving force to the center of gravity as the object table is moved, that would improve the driving efficiency and performance.

SUMMARY OF THE INVENTION

It is thus an object of the invention to seek to align a driving force with a center of gravity of a load being driven when positioning such a load.

According to a first aspect of the invention there is provided apparatus for positioning a mass, comprising driving means to move the mass along an axis, which mass has a variable center of gravity position perpendicular to said axis, wherein a driving force from the driving means is operative to act through the center of gravity of the mass as the position of the center of gravity changes.

According to a second aspect of the invention there is provided a method for positioning a mass, comprising moving the mass along an axis, which mass has a variable center of gravity position perpendicular to said axis and whereby a force is maintained operative to act through the center of gravity of the mass as the position of the center of gravity changes.

Using a single driving force, it is difficult to move the direction of the driving force so that it is aligned with the mass each time. Using the invention it is possible to use a combination of forces to drive the said mass, wherein the combination of forces results in a force acting through the center of gravity of a moving mass as the mass is being driven along an axis.

Preferably, each driving force may be provided by a separate motor.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

DETAILED DESCRIPTION OF THE PREFERRED EMBODIMENT

Figure 1:
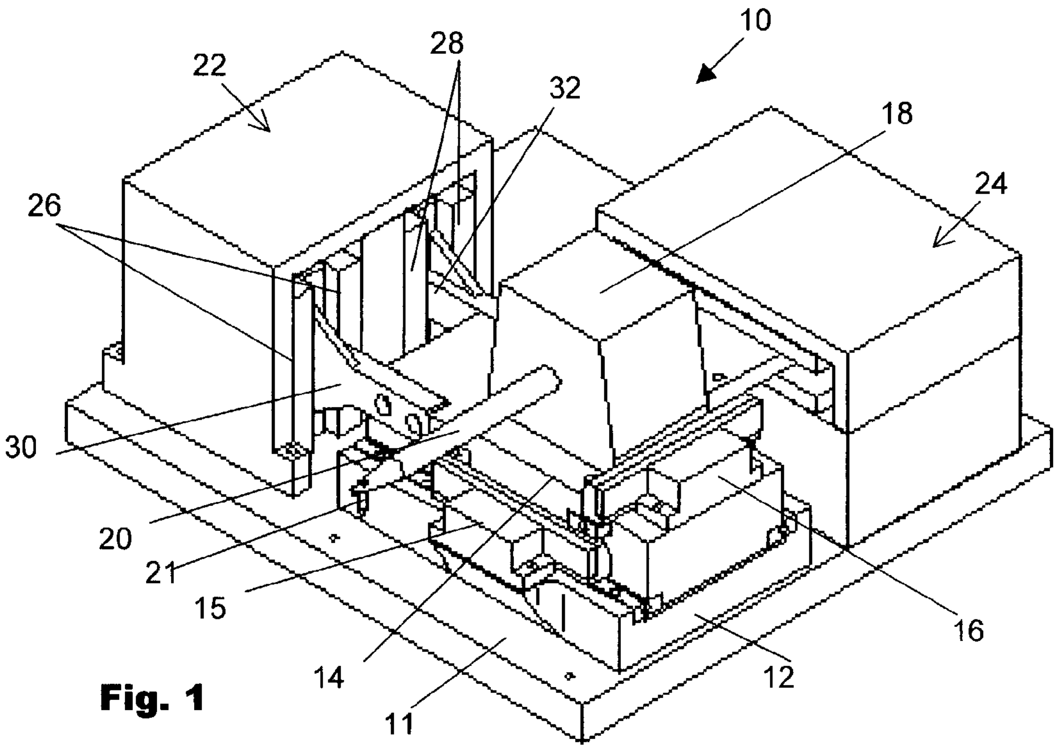
FIG. 1 is an isometric view of an XY table assembly with a bond head attached.

Referring to the drawings, FIG. 1 is an isometric view of an apparatus having an XY table assembly 10 with a bond head 18 attached. The XY table assembly 10 comprises a first stage, usually called an X stage 12, which is driven by driving means such as an X motor assembly 22 mounted on a platform 11. A second stage, usually called a Y stage 14 is in turn mounted on the X stage 12 and is driven by a Y motor assembly 24 mounted on the platform 11. An X-axis linear encoder 15 detects a position of the X stage 12, whereas a Y-axis encoder 16 detects a position of the Y stage 14 at any given time.

The described embodiment relates to the use of the XY table assembly 10 for semiconductor wire bonding. Thus, a mass or load comprising a bond head 18 with a bonding member 20 which has a bond tip 21 is attached to a top surface of the Y stage 14. The contemporaneous movement of the X stage 12 and Y stage 14 function to position the bond tip 21 of the bonding member 20 in the X and Y axes to a position on a semiconductor device whereat a bonding wire is to be bonded. Generally, the X stage 12, Y stage 14 and load 18, 20, 21 and associated components may be referred to as a movable mass.

The X motor assembly 22 comprises a plurality of motors, which are illustrated in the form of two linear motors in this embodiment. A front (in use) linear motor includes a front set of magnets 26 and front coil bracket 30 holding a coil (or set of coils) 34 (see FIG. 3). A rear (in use) linear motor includes a rear set of magnets 28 and rear coil bracket 32 holding a rear coil (or set of coils) 36. Each linear motor works on a moving-coil principle, each moving coil 34, 36 being disposed between a set of permanent magnets 26, 28. As each coil 34, 36 is energized by current flowing through it, a force actuated by electromagnetic induction causes the coil 34, 36, coil bracket 26, 28 and therefore the connected X stage 12 to move in the X axis.

Correspondingly, the Y motor assembly also comprises a linear motor (not shown) to drive the Y stage 14. The Y stage 14 is mounted on the X stage 12, such that the weight of the Y stage 14 is carried by the X stage 12. For the Y stage 14, the Y motor driving force is designed to always act through the center of gravity of the Y stage 14, and there is generally no variation in its center of gravity. Thus, the Y stage 14 will not be further discussed.

Figure 2:
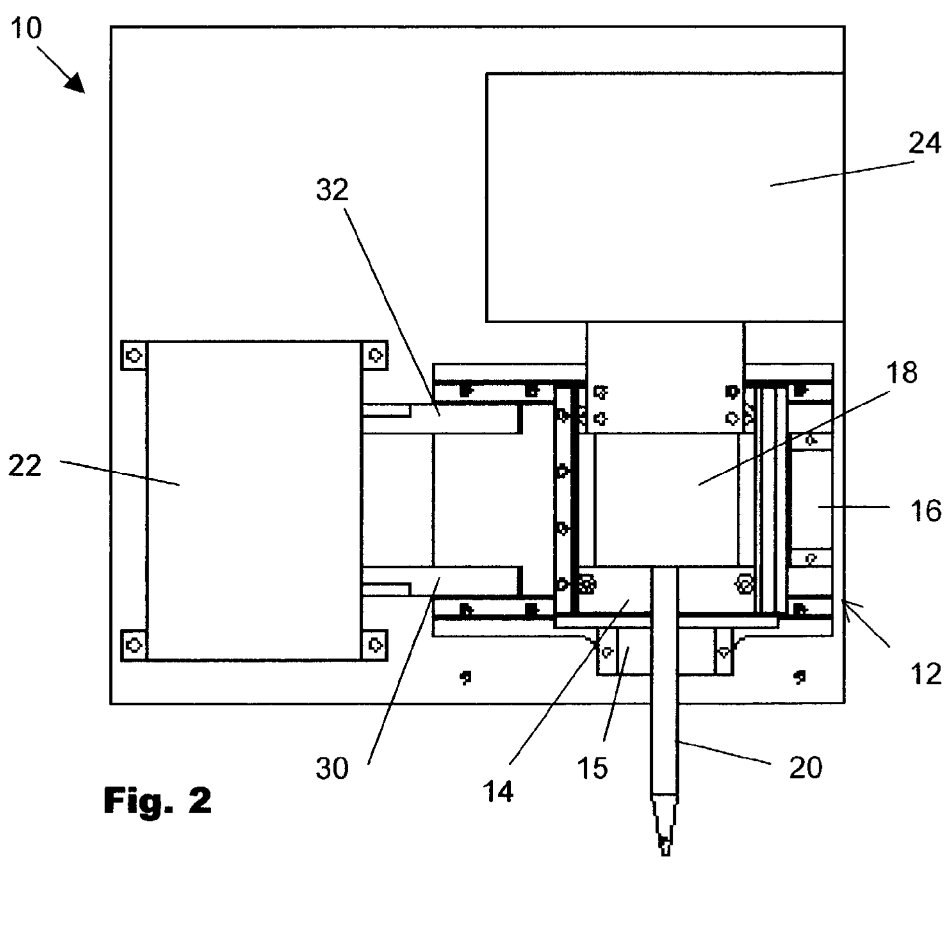
FIG. 2 is a plan view of the XY table assembly of FIG. 1.

FIG. 2 is a top view of the XY table assembly 10 of FIG. 1. In this view, the relative orientations of the X stage 12, Y stage 14 and bonding member 20 in the XY axes are shown.

Figure 3:
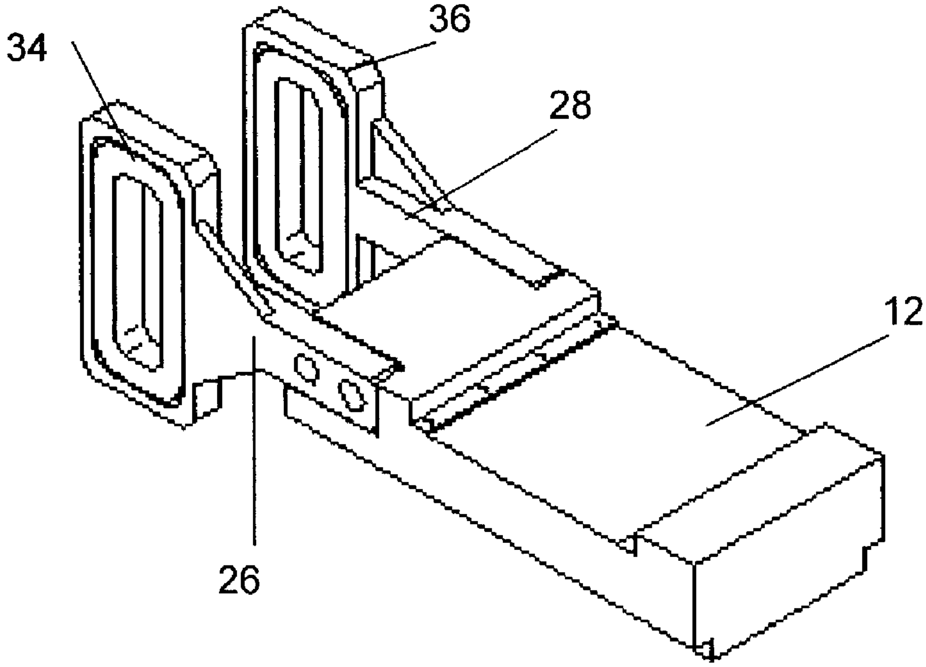
FIG. 3 is an isometric view of only an X stage of the XY table assembly and attached coil brackets.
Figure 4:
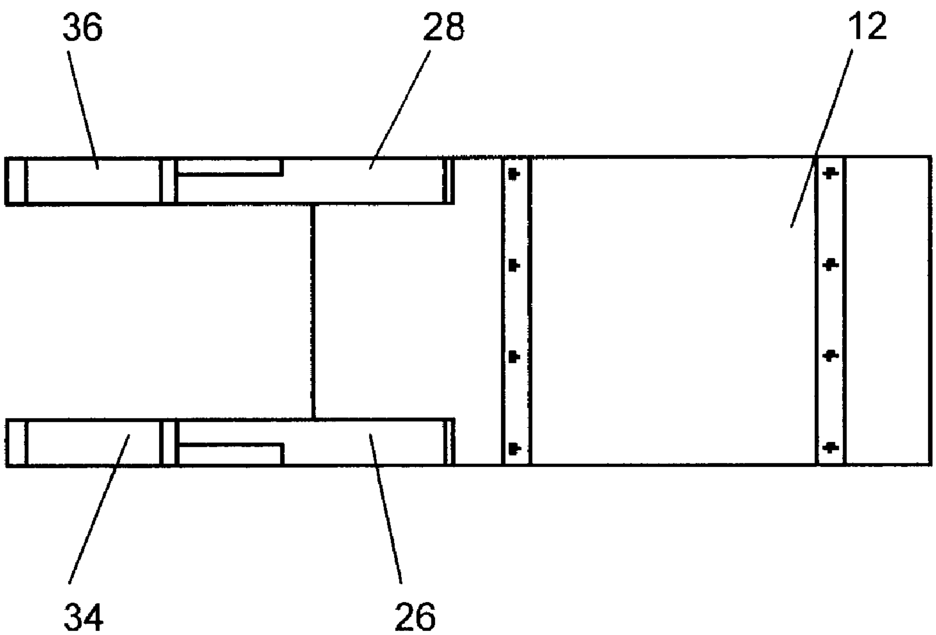
FIG. 4 is a plan view of the X stage of FIG. 3.

FIG. 3 is an isometric view of only the X stage 12 and attached coil brackets 26, 28. The front and rear coil brackets 26, 28 have at their ends, a front coil 34 and a rear coil 36. FIG. 4 is a plan or view from on top of the X stage 12 of FIG. 3.

It will be understood that since the Y stage 14 is mounted on the X stage 12, the center of gravity of the movable mass of the XY table comprising the combined weight of the X stage 12, Y stage 14, load 18, 20, 21 and associated components supported by them will shift as the Y stage 14 is moved. If there were only a single motor applying a single force, the non-alignment between the driving force and the center of gravity would result in a turning moment applied to the XY table that would cause the movable mass to vibrate when in motion, making the application of force to position the bonding member 20 less efficient. This is very undesirable especially in the case of small semiconductor devices, wherein the position of the bonding member 20 must be precise in order to bond wires accurately.

Figure 5:
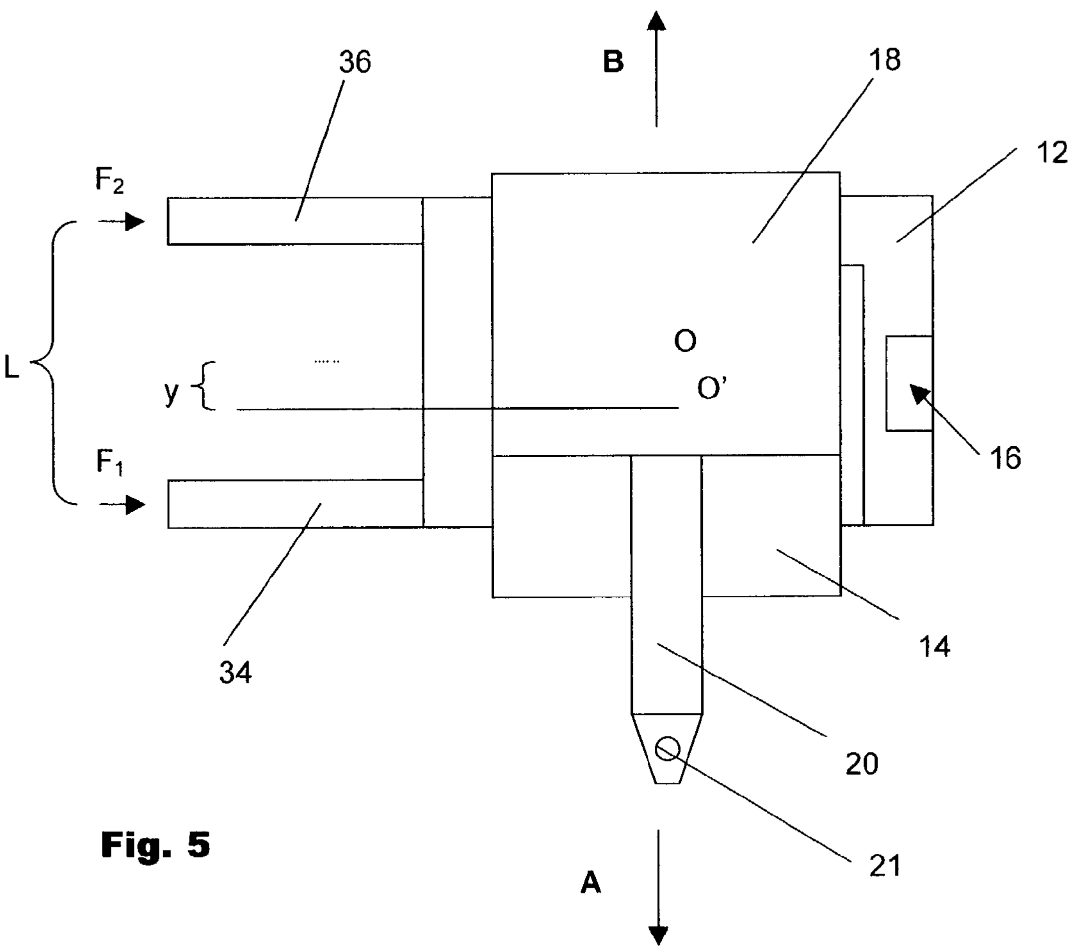
FIG. 5 is a schematic illustration of the combination of forces applied to the X stage of the XY table assembly.

To illustrate the principle of the invention, FIG. 5 is a schematic illustration of the combination of forces $F_1$, $F_2$ applied to the X stage of the XY table in order to ensure that the effective driving force from the combination of forces always acts through the center of gravity at two positions O and O' of the XY table. A driving force generated by the front (in use) linear motor is indicated by $F_1$ whereas a force generated by the rear (in use) linear motor is indicated by $F_2$.

The original center of gravity of the XY table is indicated by O in an equilibrium position, and by O' in a position wherein the Y stage 14 has moved in direction A in the Y axis.

Generally, when the Y stage 14 moves forwards (in direction A), more current is provided to the front coil 34 and less current to the rear coil 36. Conversely, when the Y stage 14 moves rearwards (in direction B) more current is provided to the rear coil 36 and less current to the front coil 34.

The respective forces $F_1$, $F_2$ that should drive the X stage is represented by the representative formulae:

$$F_1 = Ma\left(\frac{1}{2} + \frac{m}{M}\frac{y}{L}\right)$$

$$F_2 = Ma\left(\frac{1}{2} - \frac{m}{M}\frac{y}{L}\right)$$

Where

- $F_1$—driving force from the coil 34 of the front X motor;
- $F_2$—driving force from the coil 36 of the rear X motor,
- M—the total moving mass in the X axis. Since the Y stage is mounted on the X stage, it also includes the moving mass (m) of the Y stage;
- m—total moving mass of the Y stage.
- a—acceleration required to move the table in the X axis;
- y—the distance moved by the Y stage from equilibrium or center position. It can be obtained from the reading of the Y linear encoder 16;
- L—the distance between driving forces $F_1$, $F_2$ of the X motor assembly;
- O—center of gravity position of the XY table in the X axis when the Y stage is at equilibrium location. At this position, it is arranged such that $$F_{o1} = F_{o2} = \frac{1}{2}Ma$$

- $F_{o1}$—$F_1$ when Y stage is at equilibrium position;
- $F_{o2}$—$F_2$ when Y stage is at equilibrium position;
- O'—center of gravity position of the XY table in the X axis when Y stage moves distance y;

By maintaining this relationship, it could be ensured that the combined X motor assembly driving force ($F_1$+$F_2$) would be through the center of gravity of the moving mass at all of the Y stage 14 positions. The relative forces $F_1$, $F_2$ may be controlled by varying the electric current ratio flowing through the front and rear coils 34, 36. Thus, the determined electric current ratio between the front and rear coils 34, 36 is accordingly based on the position of the Y stage 14. This helps to reduce any undesired moment generated by misalignment of the driving force and center of gravity, whatever the position of the bonding member 20.

In apparatus embodying the present invention, it will be understood that with less vibration of the movable mass when in motion, easier control and better performance of the XY table may be attained at different top-table (Y stage 14) positions. The difference in bottom-table (X stage 12) performance in the X-axis for the whole bonding area may be reduced.

The invention described herein is susceptible to variations, modifications and/or additions other than those specifically described and it is to be understood that the invention includes all such variations, modifications and/or additions which fall within the spirit and scope of the above description.

What is claim is:

1. Apparatus comprising:

a stage movable along a first axis;

a load mounted on the stage and movable relative to the stage along a second axis perpendicular to the first axis whereby the movement of the load on the stage causes the position of the center of gravity of the apparatus to move along the second axis;

a sensor which provides an output signal representative of the movement of the center of gravity; and a drive assembly operative to generate a driving force to move the stage along the first axis, the drive assembly being responsive to the sensor output signal to vary the driving force such that the driving force effectively acts through the center of gravity of the apparatus irrespective of the movement thereof.

2. Apparatus according to claim 1, wherein:

the drive assembly includes a plurality of motors positioned to apply respective driving forces to the stage in the direction of the first axis; and the drive assembly is operative to control the respective driving forces relative to one another according to the sensor output signal to vary the effective position at which the combined forces act along the second axis.

3. Apparatus according to claim 2, wherein the motors are linear motors each comprising a coil disposed between a pair of magnets to generate a driving force through electromagnetic interaction.

4. Apparatus according to claim 2, wherein the position of the effective driving force generated by the plurality of motors is adapted to be variable by varying the current flow through each coil of the respective motors.

5. Apparatus according to claim 2, wherein the drive assembly employs a total of two motors.

6. Apparatus according to claim 1, wherein the stage and load comprise stages of an XY table.

7. Apparatus according to claim 6, wherein the load includes a bond head and bonding member of a wire bonder.

8. Apparatus according to claim 2, including a drive mechanism driving the load along the second axis.

9. A method for positioning a stage along a first axis, said stage supporting a load movable relative to the stage such that the position of the center of gravity of the stage and load varies along a second axis perpendicular to the first axis due to said relative movement, the method comprising the steps of:

applying a driving force to said stage which acts in the direction of the first axis;

sensing change in the position of the center of gravity; and varying an effective position at which said driving force acts in response to change of the position of the center of gravity such that the driving force effectively acts through the center of gravity of the stage and load irrespective of changes in the position thereof.

10. Method according to claim 9 wherein the driving force is provided by a plurality of separate forces acting on the stage, which forces are adjustable with respect to each other whereby to vary the position of the effective force to act through the center of gravity of the stage and load.

11. Method according to claim 10, wherein the separate forces are generated by linear motors each comprising a coil disposed between a pair of magnets to generate a driving force through electromagnetic interaction.

12. Method according to claim 11, including the step of varying the current flow through each coil of the respective motors to vary the effective position of the driving force.

13. The method according to claim 9, farther including the step of applying a force to drive the load along the second axis.

* * * * *